US012660704B2

(12) United States Patent
Kang et al.

(10) Patent No.: US 12,660,704 B2
(45) Date of Patent: Jun. 16, 2026

(54) ELECTRONIC DEVICE AND CHIPLET MODULE

(71) Applicant: Advanced Semiconductor Engineering, Inc., Kaohsiung (TW)

(72) Inventors: Jung Jui Kang, Kaohsiung (TW); Chang Chi Lee, Kaohsiung (TW); Hung-Chun Kuo, Kaohsiung (TW); Chun-Yen Ting, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 397 days.

(21) Appl. No.: 18/223,526

(22) Filed: Jul. 18, 2023

(65) Prior Publication Data

US 2025/0029970 A1     Jan. 23, 2025

(51) Int. Cl.
| | |
|---|---|
| *H10W 90/00* | (2026.01) |
| *H10B 80/00* | (2023.01) |
| *H10W 72/00* | (2026.01) |

(52) U.S. Cl.
CPC ............ *H10W 90/00* (2026.01); *H10B 80/00* (2023.02); *H10W 72/07554* (2026.01); *H10W 72/879* (2026.01); *H10W 90/724* (2026.01); *H10W 90/754* (2026.01)

(58) Field of Classification Search
CPC .......... H01L 25/18; H01L 24/16; H10B 80/00

USPC .......................................... 361/737
See application file for complete search history.

(56) References Cited

U.S. PATENT DOCUMENTS

| | | | | |
|---|---|---|---|---|
| 2008/0062734 A1* | 3/2008 | Leddige | .................. | G11C 5/02 |
| | | | | 365/51 |
| 2020/0176431 A1* | 6/2020 | Zhong | .................. | H01L 25/105 |
| 2021/0333996 A1* | 10/2021 | Gorobets | ............. | G06F 3/0619 |
| 2024/0030125 A1* | 1/2024 | Kang | ............... | H01L 23/49816 |

FOREIGN PATENT DOCUMENTS

WO      WO-2022169970 A1 *    8/2022    ........... H04B 10/801

OTHER PUBLICATIONS

U.S. Appl. No. 17/715,872, filed Apr. 7, 2022, Lin et al.

* cited by examiner

*Primary Examiner* — Andargie M Aychillhum
(74) *Attorney, Agent, or Firm* — Foley and Lardner LLP

(57) ABSTRACT

The present disclosure provides an electronic device, which includes a circuit structure, a processing component, a first storage unit, and a second storage unit. The processing component is disposed over the circuit structure. The first storage unit is supported by the circuit structure, and electrically connected to the processing component. The second storage unit is disposed under the circuit structure and electrically connected to the processing component via the circuit structure.

7 Claims, 10 Drawing Sheets

ELECTRONIC DEVICE AND CHIPLET MODULE

BACKGROUND

1. Technical Field

The present disclosure relates to semiconductor packages, and, in particular, to an electronic device and a chiplet module.

2. Description of the Related Art

An X processing unit (XPU) may include a plurality of function regions, such as one or more processing cores, input/output (I/O) interfaces, cache memories, and a memory controller. Efforts at chip miniaturization can encounter bottlenecks in the static random access memory (SRAM) area. For example, SRAMs in 3 nm and 5 nm technologies may have approximately the same area (e.g., about 0.021 $\mu m^2$), impacting miniaturization of the overall XPU floorplan.

The processing cores and SRAM in an XPU can be respectively manufactured as a processing chiplet and an SRAM chiplet. If the technology node of the processing chiplet of the XPU is smaller than that of the SRAM, the area of the SRAM may be much larger than that of the processing chiplet, resulting in difficulties in stacking the SRAM chiplet on the processing chiplet. If SRAM capacity is to be increased, multiple SRAMs can only be stacked. In addition, the stacked SRAMs are electrically connected to the processing chiplet through TSVs (through-silicon vias), which increase costs of the SRAM chiplet. As more SRAMs are stacked, connection path between the SRAM and the processing chiplet increases accordingly.

SUMMARY

Some arrangements disclosed herein relate to an electronic device, which includes a circuit structure, a processing component, a first storage unit, and a second storage unit. The processing component is disposed over the circuit structure. The first storage unit is supported by the circuit structure, and electrically connected to the processing component. The second storage unit is disposed under the circuit structure and electrically connected to the processing component via the circuit structure.

Some arrangements disclosed herein relate to a chiplet module, which includes a circuit structure, a first processing chiplet, and a first memory chiplet. The circuit structure has a first side and a second side opposite to the first side. The processing structure includes a first processing chiplet and a first memory chiplet. The first processing chiplet is disposed at the first side of the circuit structure, and a portion of the first side being exposed by the first processing chiplet. The first memory chiplet is disposed at the second side of the circuit structure and electrically connected to the first processing chiplet via the circuit structure.

Some arrangements disclosed herein relate to an electronic device, which includes a circuit structure, a processing component, a storage structure, and an optoelectronic structure. The processing component is disposed over the circuit structure. The storage structure is disposed under the circuit structure, and is configured to provide data to be accessed by the processing component. The optoelectronic structure is disposed over the circuit structure, and is configured to provide optoelectronic transmission paths between the processing component and an external device.

BRIEF DESCRIPTION OF THE DRAWINGS

Aspects of some arrangements of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
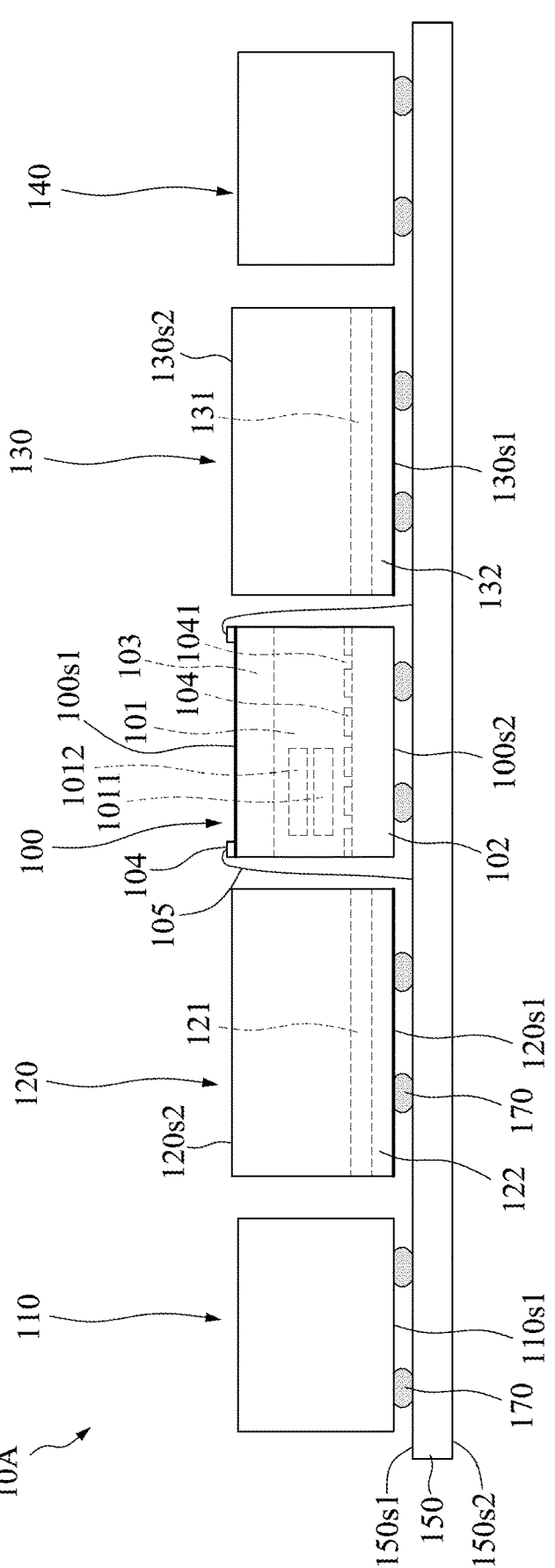
FIG. 1A is a side view of a semiconductor package structure 10A in accordance with an arrangement of the present disclosure.

The following disclosure provides various arrangements, implementations, solutions, and examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact with one another, and may also include arrangements in which one or more additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such arrangement.

The term "layer" as used herein refers to a portion of material comprising a region having a certain thickness. A layer may extend across the entire underlying or superstructure, or may have an extent that is less than the entire extent (e.g., length and/or width) of a structure or superstructure. In addition, a layer may be a region of a homogeneous or heterogeneous continuous structure, where the thickness of region is less than that of the continuous structure. For example, a layer may be located between the top and bottom surfaces of the continuous structure or between any pair of horizontal planes therebetween. Layers may extend horizontally, vertically, and/or along the tapered surface of a structure. A substrate can be one layer, can include one or more layers therein, and/or can have one or more layers thereon, above, and/or below. A layer can further include multiple layers. For example, a semiconductor layer may comprise one or more doped or undoped semiconductor layers, and may be of the same or different materials.

It should be noted that the structures, proportions, sizes, etc. shown in the drawings of the specification are illustrative of the content recorded in the specification for the understanding and reading of those skilled in the art, and are not used to limit the implementation of this application. Any modification of structure, change of proportional relationship or adjustment of size, without affecting the effect and purpose of this application, should still fall within the scope of this application. The disclosed technical content must be within the scope covered. At the same time, terms such as "first", "second" and "one" in this specification are only for the convenience of description and are not used to limit the scope of implementation of this application. The change or adjustment of the relative relationship shall also be regarded as the implementable scope of the present application without substantive change in the technical content. Similar or the same components referred to using the same terminology can be referred to using the same or different reference numerals throughout, and the definitions, functions, structures, and operations of similar or the same components referred to using the same or different reference numerals are applicable to all such similar or the same components unless otherwise described herein.

As used herein, the term "active side" or "active surface" of an electronic component may refer to a side or a surface of an electronic component on which electrical or contact terminals such as contact pads, conductive studs or conductive pillars are disposed, for transmission of electrical signals or power. The "inactive side," "passive side," "inactive surface," or "passive side" of an electronic component may refer to a surface of the electronic component on which no contact terminals are disposed.

It should also be noted that the longitudinal section corresponding to the arrangements of the present application can be a section corresponding to the front view direction, the transverse section can be a section corresponding to the right view direction, and the horizontal section can be a section corresponding to the direction of the top view.

FIG. 1A is a side or cross-sectional view of a semiconductor package structure 10A in accordance with an arrangement of the present disclosure.

In some arrangements, the semiconductor package structure 10A may include a processing component 100, a first storage unit 110, a second storage unit 120, a third storage unit 130, a fourth storage unit 140, and a circuit structure 150, as shown in FIG. 1A. In some arrangements, the processing component 100 may include one or more processing elements and one or more memory elements electrically connected to the processing elements. The processing element(s) and the memory element(s) of the processing component 100 may be divided from or originate in a monolithic processing unit (e.g., a central processing unit (CPU), a microprocessor unit (MPU), a graphics processing unit (GPU), a microcontroller unit (MCU), a data processing unit (DPU), a neural network processing unit (NPU), tensor processing unit (TPU), an application-specific integrated circuit (ASIC), a field-programmable gate array (FPGA), or the like). In some arrangements, the processing element of the processing component 100 may be a CPU chiplet, a MCU chiplet, a GPU chiplet, a DPU chiplet, an NPU chiplet, a TPU chiplet, an ASIC chiplet, an FPGA chiplet, or the like. In some arrangements, the memory element of the processing component 100 may be or include a cache memory. In some arrangements, the processing component 100 may be or include one or more processing cores. Specifically, chiplets may be small modular chips or small integrated circuit (IC) dies with specialized functionality that can be combined to form larger more complex chips, such as a system-on-chip (SoC). In such chips, a system is subdivided into functional circuit blocks, called "chiplets," that are often made of reusable intellectual property (IP) blocks. In addition, a chiplet may be a tiny IC that can be configured for a defined or designated set of functionalities. Two or more chiplets can be configured or otherwise designed to be combined with other chiplets, for example, on an interposer in or as a unit (e.g., a single package). A set of chiplets can be implemented in a mix-and-match "interlocking tile/brick-like" assembly. Multiple chiplets working together in a single IC may be called a multi-chip module, hybrid IC, 2.5D IC, or any advanced package.

In some arrangements, the processing component 100 may comprise one or more processing elements, such as cache-less processors. Each of the processing elements may be a CPU chiplet, a MCU chiplet, a GPU chiplet, a DPU chiplet, an NPU chiplet, a TPU chiplet, an ASIC chiplet, an FPGA chiplet, or the like. In addition, the second storage unit 120 and the third storage unit 130 may be volatile memories such as cache memories. Each of the cache memories may be a memory chiplet including a SRAM (e.g., a volatile memory). The processing elements and the cache memories may be divided from or originate in a monolithic processing unit (e.g., a CPU, a MPU, a GPU, an MCU, a DPU, an NPU, a TPU, an ASIC, an FPGA, or the like).

In some arrangements, the processing component 100 may include, for example, a chiplet of a CPU, a MPU, a GPU, an MCU, a DPU, an NPU, a TPU, an ASIC, an FPGA, or another type of integrated circuit.

In some arrangements, the processing component 100 may be a processor chiplet (e.g., a cache-less processor). The second storage unit 120 and the third storage unit 130 may be memory chiplets (e.g., cache memory chiplets) in some arrangements.

In some arrangements, the first storage unit 110 and the fourth storage unit 140 may be high-bandwidth memories (HBM), and they may be electrically connected to the processing component 100 via the circuit structure 150. For example, a high-bandwidth memory may be a high-speed computer memory interface for 3D-stacked synchronous dynamic random-access memory. The high-bandwidth memory can be used in conjunction with the processing component 100, which may be or include high-performance processing components, such as CPUs, MPUs, GPUs, MCUs, DPUs, NPUs, TPUs, ASICs, FPGAs, and other hardware accelerators, that can be collectively regarded as XPUs, depending on the practical application of the semiconductor package structure 10A. In addition, the high-bandwidth memory can achieve higher bandwidth while using less power in a substantially smaller form factor than DDR4 (Double Data Rate 4) or GDDR5 (graphics Double Data Rate 5). The width of the HBM memory bus is considerably wider in comparison to the width of other dynamic random access memories (DRAMs) such as DDR4 or GDDR5.

In some arrangements, the circuit structure 150 may include a surface 150s1 and a surface 150s2 opposite to the surface 150s1. The processing component 100, the first storage unit 110, the second storage unit 120, the third storage unit 130, and the fourth storage unit 140 may be disposed on the surface 150s1 via respective electrical contacts 170. Each electrical contact 170 is disposed between the surface 150s1 and a respective one of the processing component 100, the first storage unit 110, the second storage unit 120, the third storage unit 130, and the fourth storage unit 140. The electrical contacts 170 with respect to the processing component 100 (between the processing component 100 and the surface 150s1) may be disposed on the surface 100s2 of the processing component 100. The electrical contacts 170 with respect to the first storage unit 110 (between the first storage unit 110 and the surface 150s1) may be disposed on the surface 110s1 of the first storage unit 110. The electrical contacts 170 with respect to the second storage unit 120 (between the second storage unit 120 and the surface 150s1) may be disposed on the surface 120s1 of the second storage unit 120. The electrical contacts 170 with respect to the third storage unit 130 (between the third storage unit 130 and the surface 150s1) may be disposed on the surface 130s1 of the third storage unit 130. The electrical contact 170 with respect to the fourth storage unit 140 (between the fourth storage unit 140 and the surface 150s1) may be disposed on the surface 140s1 of the fourth storage unit 140. In some arrangements, the electrical contacts 170 may be covered or encapsulated at least partially by an underfill (not shown in FIG. 1A) to increase the rigidity of the electrical contacts 170. In some arrangements, the circuit structure 150 may include an electronic interposer, a circuit board, or a circuit structure, but the present disclosure is not limited thereto. In some arrangements, the electrical contacts 170 may include controlled collapse chip connection (C4) bumps, a ball grid array (BGA), or a land grid array (LGA). In some arrangements, the processing component 100, the second storage unit 120, and the third storage unit 130 may be disposed over the circuit structure 150 side by side, thus solving the issue that it is difficult to stack the second storage unit 120 or the third storage unit 130 (e.g., cache-memory chiplets) on the processing component 100 due to limited capability of reducing the technology node or size of the second storage unit 120 or the third storage unit 130.

In some arrangements, the processing component 100, the first storage unit 110, the second storage unit 120, the third storage unit 130, the fourth storage unit 140, and the circuit structure 150 may be covered or encapsulated by a protective component (not shown in FIG. 1A) which may include an encapsulant or a dielectric structure. The protective component may include an epoxy resin including fillers, a molding compound (e.g., an epoxy molding compound or other molding compound), polyimide, a phenolic compound or material, a material including silicone dispersed therein, or a combination thereof.

In some arrangements, the processing component 100 may include a logic region (e.g., a functional circuitry) 101, a power delivery network (e.g., a power interface or a power circuit region) 102, and a circuit structure 103. The logic region 101 may be electrically connected to the power delivery network 102 via the through-silicon vias (TSVs) 1041 of the silicon base 104. The circuit structure 103 may be a back-end of line (BEOL) section which may be an I/O interface. The processing component 100 may also include surfaces 100s1 and 100s2, and the surface 100s2 is opposite to the surface 100s1. The surface 100s1 may be regarded as a front side, a transistor side, or an active side. The surface 100s1 may have an I/O interface (not shown in FIG. 1A) of the circuit structure 103 thereon. In addition, a plurality of conductive elements 104 may be disposed on the surface 100s1, and the conductive elements 104 may electrically connect the logic region 101 to the circuit structure 150 via conductive wires 105. The logic region 101 can transmit signals to or receive signals from the circuit structure 150 via the conductive elements 104 and the conductive wires 105. The surface 100s2 may be regarded as a backside side or a passive side. The logic region 101 may be disposed closer to the surface 100s1 than the power delivery network 102 is disposed to the surface 100s1, and the power delivery network 102 may be disposed closer to the surface 100s2 than the logic region 101 is disposed to the surface 100s2, as shown in FIG. 1A. In addition, power to the processing component 100 may be provided from the circuit structure 150, on which a power regulator (not shown in FIG. 1A) is disposed, via the power delivery network 102. Thus, the processing component 100 may be provided with backside power. In some arrangements, the logic region 101 can transmit non-power-related signals to or receive non-power-related signals from the circuit structure 150 via the power delivery network 102. In some arrangements, power to the logic region 101 of the processing component 100 can be transmitted from the circuit structure 150 via the conductive elements 104 and the conductive wires 105.

In some arrangements, the second storage unit 120 may include a logic region 121 (e.g., functional circuitry including a memory cell array and control logic) and a circuit structure 122. In addition, the second storage unit 120 may also include surface 120s1 and 120s2, and the surface 120s2 is opposite to the surface 120s1. The surface 120s1 may be regarded as a front side or an active side. The surface 120s2 may be regarded as a backside or a passive side. The electrical contacts 170 with respect to the second storage unit 120 may electrically connect the logic region 121 to the circuit structure 150 via the circuit structure 122. In addition, the circuit structure 122 may be a BEOL section or an I/O interface, that includes power pins (not shown), and power to the second storage unit 120 may be provided from the circuit structure 150 via the power pins of the circuit structure 122. Thus, the second storage unit 120 may be provided with front-side power.

In some arrangements, the third storage unit 130 may include a logic region 131 (e.g., functional circuitry including a memory cell array and control logic) and a circuit structure 132. In addition, the third storage unit 130 may also include surfaces 130s1 and 130s2, and the surface 130s2 is opposite to the surface 130s1. The surface 130s1 may be regarded as a front side or an active side. The surface 130s2 may be regarded as a backside or a passive side. The electrical contacts 170 with respect to the third storage unit 130 may electrically connect the logic region 131 to the circuit structure 150 via the circuit structure 132. In addition, the circuit structure 132 may include power pins (not shown), and power to the third storage unit 130 may be provided from the circuit structure 150 via the power pins of the circuit structure 132. Thus, the third storage unit 130 may be provided with front-side power. The first storage unit 110 and the fourth storage unit 140 may have a similar design of front-side power, and power can be provided to the first storage unit 110 and the fourth storage unit 140 via respective electrical contacts 170.

In some arrangements, the logic region 101 of the processing component 100 may include a memory controller 1011 and a memory interface 1012. The memory interface 1012 may be a memory physical (PHY) interface. The memory interface 1012 may be configured to calibrate or synchronize memory timing between the memory controller 1011 and the first storage unit 110. The memory interface 1012 can be configured to perform memory device initialization (e.g., for first storage unit 110 and fourth storage unit 140) and single-data-rate to double-data-rate conversion. The memory controller 1011 may be configured to control data access of the first storage unit 110 and the fourth storage unit 140 via the memory interface 1012 and the circuit structure 150 based on one or more memory access commands from the processing component 100. For example, the memory controller 1011 may be configured to receive a memory access command from the processing component 100 to enable the first storage unit 110 to provide data for the processing component 100. casein some arrangements, the circuit structure 150 may function as a bridge component between the first storage unit 110 (or the fourth storage unit 140) and the processing component 100.

Accordingly, in the arrangement of FIG. 1A, the second storage unit 120 and the fourth storage unit 140 can be disposed on opposite lateral sides of the processing component 100. The processing component 100 is between second storage unit 120 and the fourth storage unit 140 along an axis parallel to one or more of the surfaces 150s1, 150s2, 100s1, 100s2, 110s1, 120s1, 120s2, 130s1, 130s2. In other words, the second storage unit 120, the processing component 100, and the fourth storage unit 140 may be arranged side-by-side, adjacent to one another. When the technology node of the processing component 100 is getting smaller and smaller (e.g., smaller than 5 nm or beyond), the second storage unit 120 and the fourth storage unit 140 (e.g., cache memory chiplets) may still use a greater technology node (e.g., greater than 5 nm or above). As used herein, a technology node refers to a size of a chip, chiplet, or semiconductor element, such as a storage unit described herein. The second storage unit 120, the processing component 100, and the fourth storage unit 140 can be placed on the same surface of the circuit structure 150. Accordingly, the problems of higher cost, higher signal loss, and lower reliability using the memory chiplet having a larger size stacked on the processing element can be solved by using the arrangement shown in FIG. 1A.

Figure 1B:
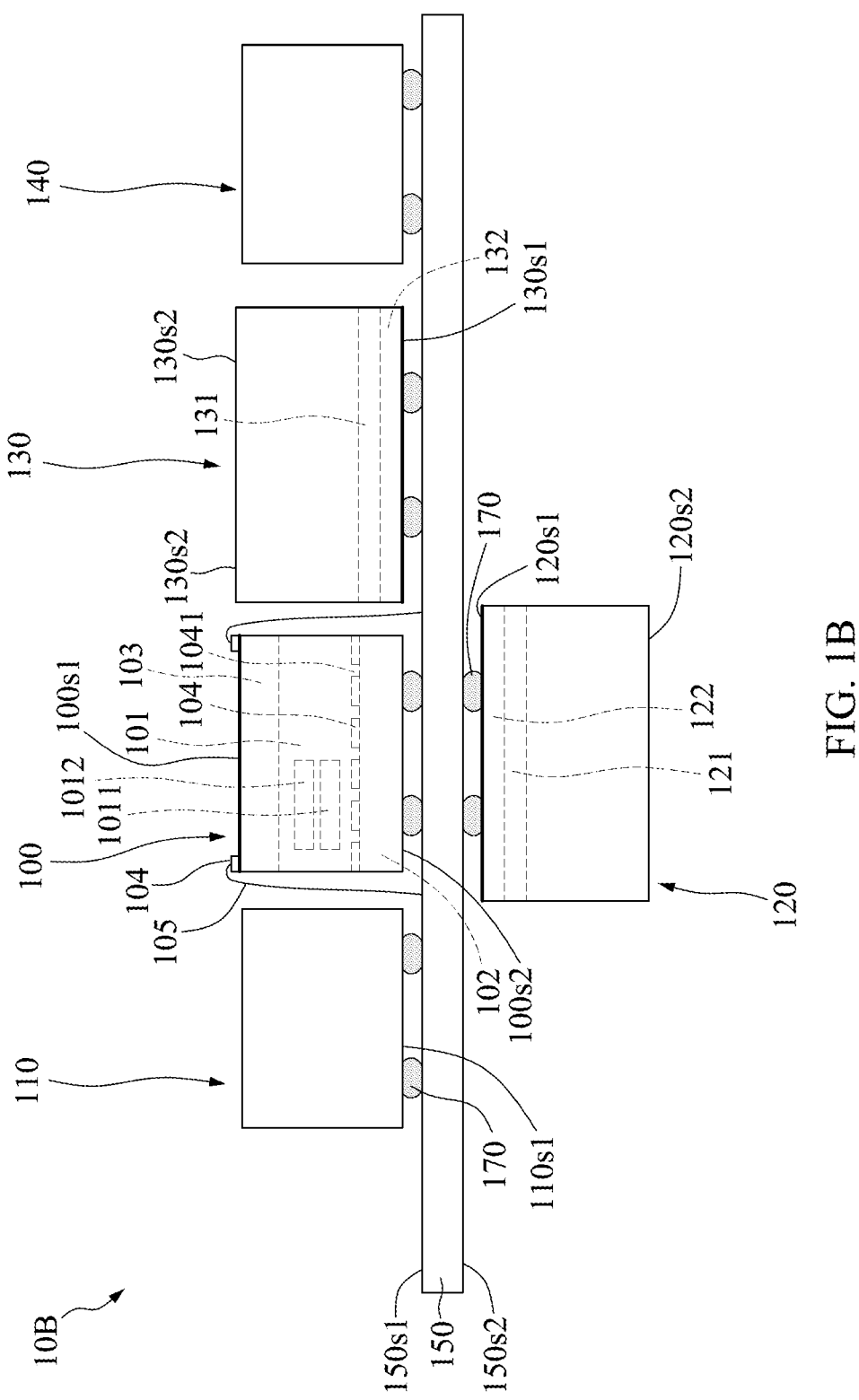
FIG. 1B is a side view of a semiconductor package structure 10B in accordance with another arrangement of the present disclosure.

FIG. 1B is a side or cross-sectional view of a semiconductor package structure 10B in accordance with another arrangement of the present disclosure. Referring to FIGS. 1A-1B, the semiconductor package structure 10B shown in FIG. 1B may be similar to the semiconductor package structure 10A shown in FIG. 1A, with the differences including that the second storage unit 120 may be disposed on the surface 150s2 opposite to the surface 150s1. For example, the second storage unit 120 may be disposed under the processing component 100, as shown in FIG. 1B, and the second storage unit 120 may be electrically connected to the processing component 100 via one or more conductive traces (not shown) within the circuit structure 150. In some arrangements, the technology node of the second storage unit 120 may be greater than that of the processing component 100, and an area of the second storage unit 120 projected on the surface 150s2 of the circuit structure 150 may be greater than an area of the processing component 100 projected on the surface 150s1. As used herein, an area of a first element projected on a surface of second element refers to an area enclosed by an outer boundary of the first element as the outer boundary is projected via an axis perpendicular to the surface of the second element. In some arrangements, a width of the second storage unit 120 may be greater than a width of the processing component 100 in the cross-sectional view or side view. The width or the horizontal direction/dimension/axis is measured across a dimension parallel to at least one of the surfaces 150s1, 150s2, 100s1, 100s2, 110s1, 120s1, 120s2, 130s1, 130s2.

The semiconductor package structure 10B shown in FIG. 1B may have a smaller package size and a shorter communication path between the second storage unit 120 and the processing component 100 than that of the semiconductor package structure 10A shown in FIG. 1A. Specifically, assuming that the processing component 100, the first storage unit 110, the second storage unit 120, the third storage unit 130, and the fourth storage unit 140 in FIG. 1B have the same respective sizes as those in FIG. 1A, the dimension of the semiconductor package structure 10B along the horizontal direction/dimension/axis is shorter than that of the semiconductor package structure 10A. In addition, the communication path between the processing component 100 and the second storage unit 120 in FIG. 1B may be from the processing component 100 to the second storage unit 120 or from the second storage unit 120 to the processing component 100 in the vertical direction/dimension/axis (e.g., perpendicular to at least one of the surfaces 150s1, 150s2, 100s1, 100s2, 110s1, 120s1, 120s2, 130s1, 130s2). Thus, the communication path between the processing component 100 and the second storage unit 120 in FIG. 1B can be reduced in comparison with that of FIG. 1A, thus improving the performance of the semiconductor package structure 10B. In some arrangements, the second storage unit 120 may overlap with the first storage unit 110 and the processing component 100 vertically, along the vertical direction/dimension/axis. For example, the second storage unit 120 may overlap with the first storage unit 110 and the processing component 100 in a direction perpendicular to at least one of the surfaces 150s1, 150s2, 100s1, 100s2, 110s1, 120s1, 120s2, 130s1, 130s2.

Figure 1D:
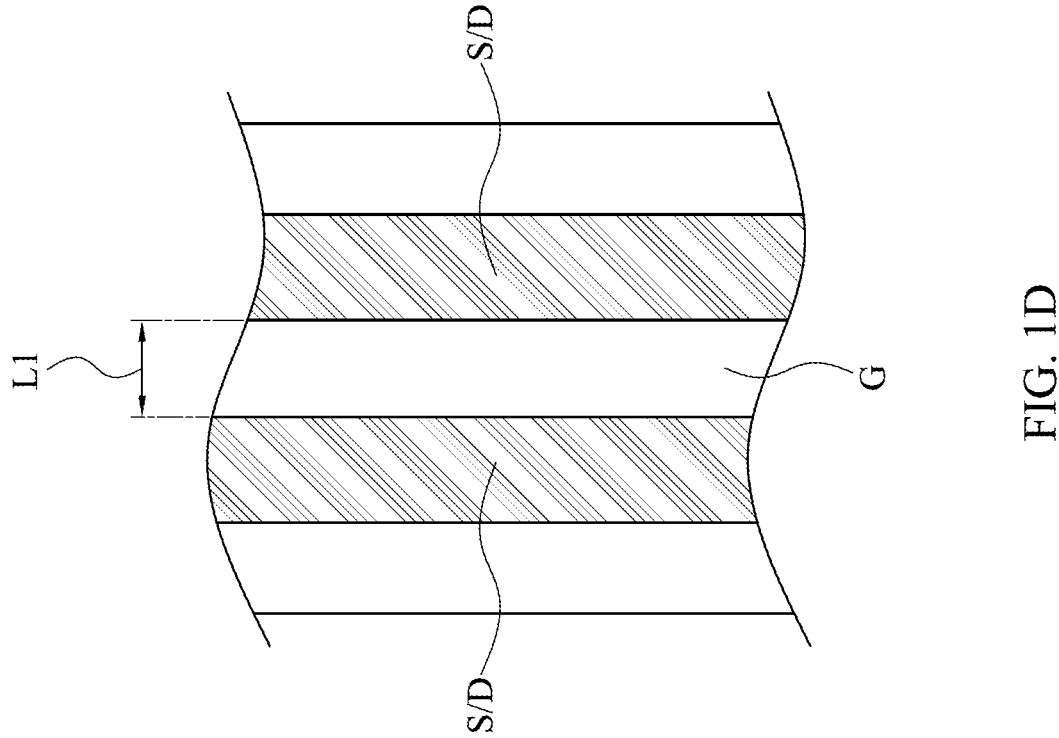
FIG. 1D illustrates a top view of a transistor of a processing element of a semiconductor package in accordance with some arrangements of the present disclosure.
Figure 1C:
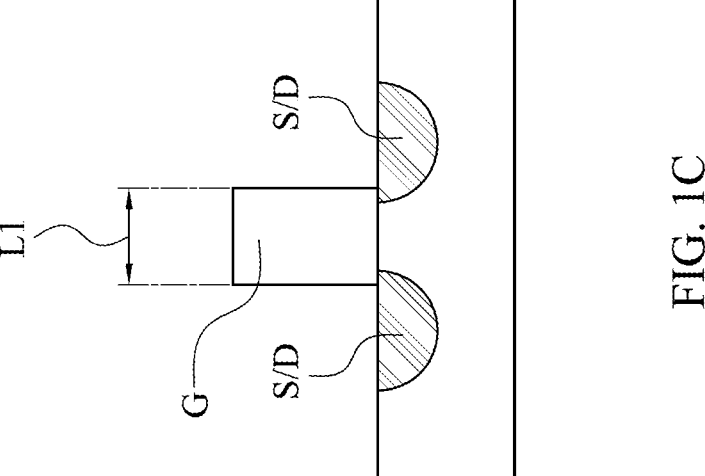
FIG. 1C illustrates a cross-sectional view of a transistor of a processing element of a semiconductor package in accordance with some arrangements of the present disclosure.
Figure 1E:
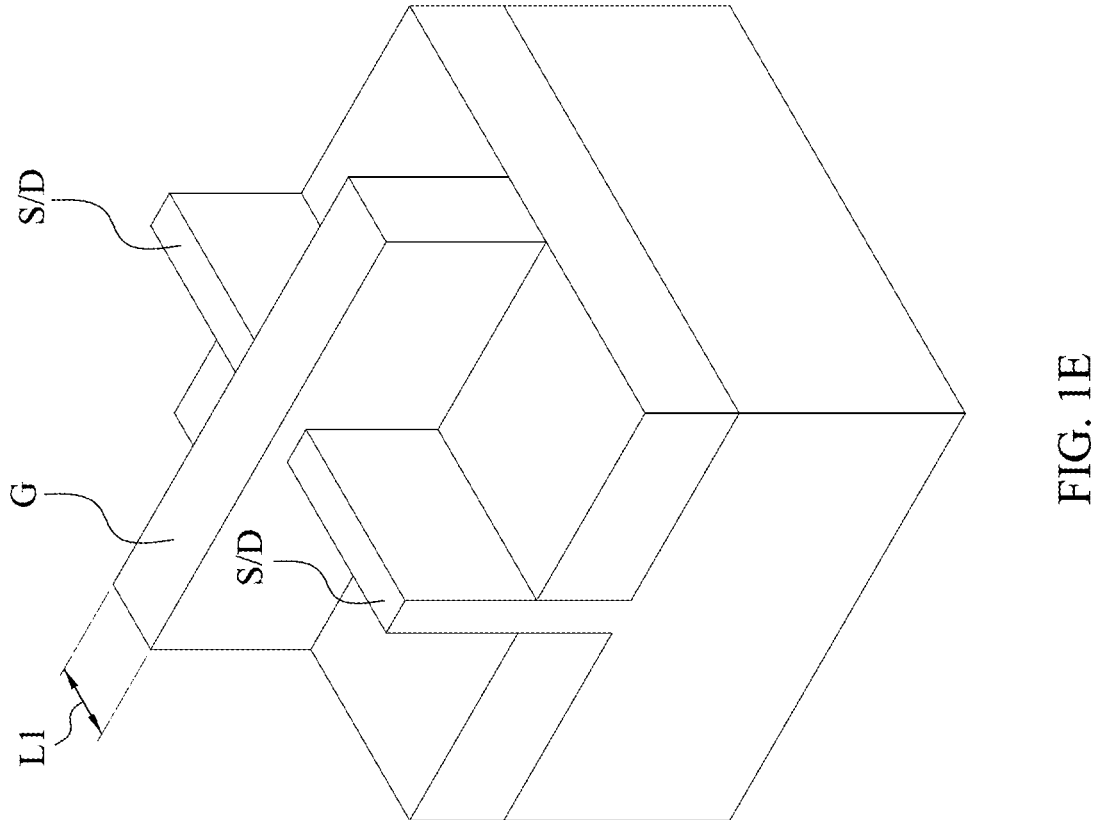
FIG. 1E illustrates a perspective view of a transistor of a processing element of a semiconductor package in accordance with some other arrangements of the present disclosure.

FIG. 1C illustrates a cross-sectional view of a transistor of a processing element of a semiconductor package in accordance with some arrangements of the present disclosure. FIG. 1D illustrates a top view of a transistor of a processing element of a semiconductor package in accordance with some arrangements of the present disclosure. In some arrangements, the transistor shown in FIGS. 1C and 1D may be a MOSFET. FIG. 1E illustrates a perspective view of a transistor of a processing element of a semiconductor package in accordance with some other arrangements of the present disclosure. In some arrangements, the transistor shown in FIG. 1E may be a FinFET.

As used herein, the term "gate length" refers to or is defined by a length L1 of a gate G along a direction extending between two source/drain regions S/D. Nanometers (nm) may be the measurement units used to measure the gate length L1. As used herein, the term "wafer node" (or "technology node", "process node", "process technology node", or "node") refers to a parameter in a specific semiconductor manufacturing process and its design rules. For example, the wafer node used herein may be defined by a minimum gate width of a chip. A smaller wafer node corresponds to a smaller feature size, which in turn corresponds to smaller transistors.

Figure 2:
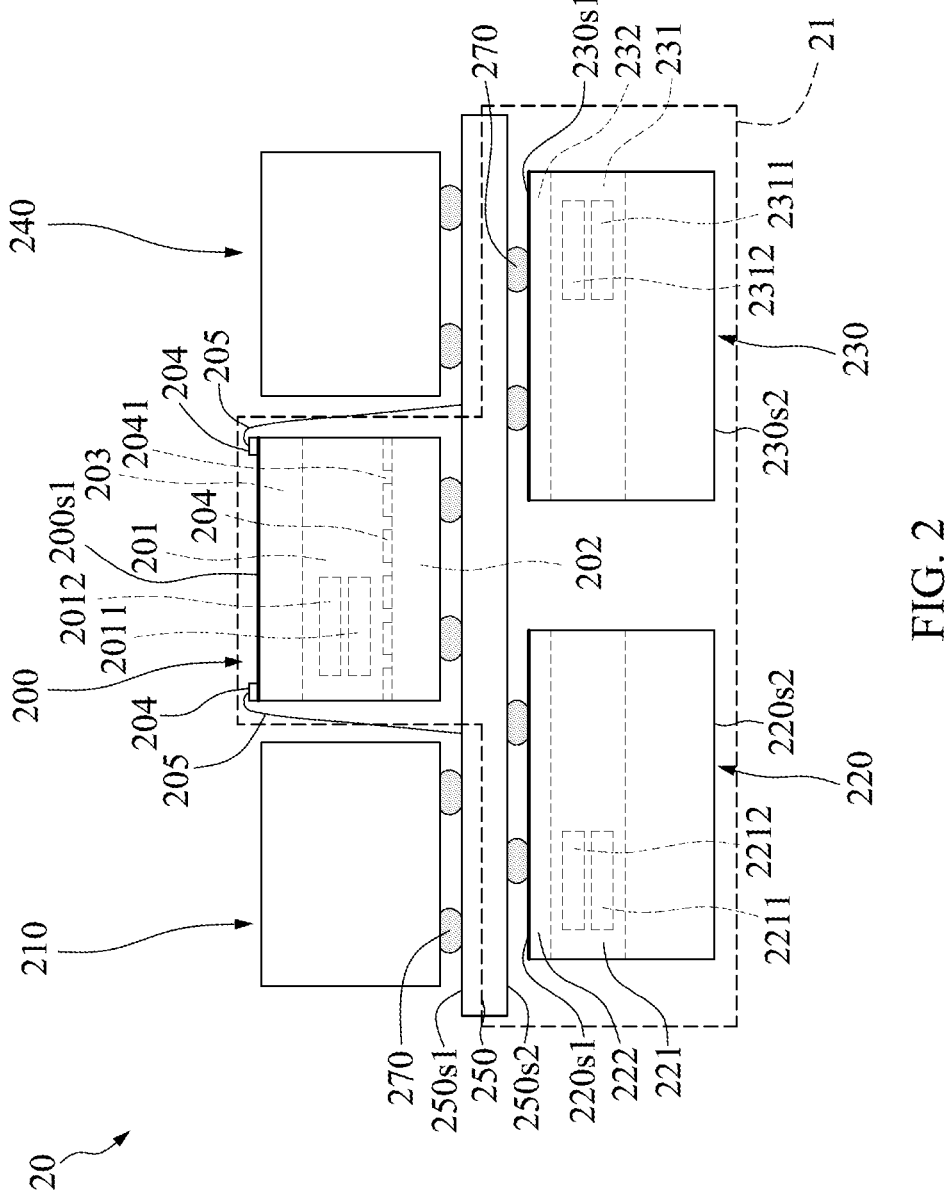
FIG. 2 is a side view of a semiconductor package structure 20 in accordance with yet another arrangement of the present disclosure.

FIG. 2 is a side or cross-sectional view of a semiconductor package structure 20 in accordance with yet another arrangement of the present disclosure. Referring to FIG. 1B and FIG. 2, the semiconductor package structure 20 shown in FIG. 2 may be similar to the semiconductor package structure 10B shown in FIG. 1B, with the differences including that the first storage unit 210 and the fourth storage unit 240 (e.g., high-bandwidth memories) are disposed on opposite lateral sides of the processing component 200. The second storage unit 220 and the third storage unit 230 (e.g., cache memory chiplets) are disposed on the surface 250$s$2 opposite to the surface 250$s$1 on which the processing component 200, the first storage unit 210, and the fourth storage unit 240 are disposed. In some arrangements, the logic region 221 of the second storage unit 220 may include a memory controller 2211 and memory interface 2212 which are respectively similar to the memory controller 1011 and memory interface 1012 shown in FIG. 1B.

In some arrangements, the processing component 200 shown in FIG. 2 may be a cache-less processor which is not equipped with the memory controller and memory interface for controlling data access of the first storage unit 210 (e.g., high-bandwidth memory). The memory controller 2211 may be configured to control data access of the first storage unit 210 (e.g., a high-bandwidth memory) via the memory interface 2212 and the circuit structure 250 based on one or more memory access commands from the processing component 200. For example, the memory controller 2211 may be configured to receive a memory access command from the processing component 200 to enable the first storage unit 210 to provide data for the processing component 200. Specifically, the second storage unit 220 may be configured to function as a bridge component between the first storage unit 210 and the processing component 200. In some arrangements, the memory controller 2211 may be further configured to control data access of the fourth storage unit 240 (e.g., another high-bandwidth memory) via the memory interface 2212 and circuit structure 250. Thus, the second storage unit 220 may also be configured to function as another bridge component between the fourth storage unit 240 and the processing component 200. In some arrangements, the processing component 200, the second storage unit 220, the third storage unit 230, and the circuit structure 250 can be collectively referred to as a processing structure 21.

In some arrangements, a portion of the first storage unit 210 and a portion of the processing component 200 may cover (e.g., overlap with) the second storage unit 220, as shown in FIG. 2. For example, the memory controller 2211 and the memory interface 2212 may be disposed under the first storage unit 210 in the vertical direction/dimension/axis (e.g., perpendicular to at least one of the surfaces 220$s$1, 220$s$2, 250$s$1, and 250$s$2) so as to reduce the length of the communication path between the memory controller 2211 and the first storage unit 210, thus reducing the resistance-capacitance (RC) delay and improving data access performance of the first storage unit 210. That is, a first distance between the memory controller 2211 and the first storage unit 210 is shorter than a second distance between the memory controller 2211 and the processing component 200. The distance between two elements as described herein may refer to the shortest distance between two closest points of the two elements or an average distance between two closest surfaces of the two elements that face each other.

In some arrangements, the logic region 231 of the third storage unit 230 may include a memory controller 2311 and memory interface 2312 which are respectively similar to the memory controller 1011 and memory interface 1012 shown in FIG. 1B. The memory controller 2311 may be configured to control data access of the fourth storage unit 240 (e.g., a high-bandwidth memory) via the memory interface 2312 based on one or more memory access commands from the logic region 201 of the processing component 200. For example, the memory controller 2311 may be configured to receive a memory access command from the processing component 200 to enable the fourth storage unit 240 to provide data for the processing component 200. Specifically, the third storage unit 230 may be configured to function as a bridge component between the fourth storage unit 240 and the processing component 200.

In some arrangements, a portion of the fourth storage unit 240 and a portion of the processing component 200 may cover the fourth storage unit 240, as shown in FIG. 2. For example, the memory controller 2311 and the memory interface 2312 may be disposed under the fourth storage unit 240 in the vertical direction/dimension/axis (e.g., perpendicular to at least one the surfaces 230$s$1, 230$s$2, 250$s$1, and 250$s$2) so as to reduce the length of the communication path between the memory controller 2311 and the fourth storage unit 240, thus reducing the RC (resistance-capacitance) delay and improving the data access performance of the fourth storage unit 240.

The semiconductor package structure 20 shown in FIG. 2 may have a smaller package size than the semiconductor package structure 10B shown in FIG. 1B. Specifically, assuming that the sizes of the processing component 200, the first storage unit 210, the second storage unit 220, the third storage unit 230, and the fourth storage unit 240 in FIG. 1B correspond to the sizes of the processing component 100, the first storage unit 110, the second storage unit 120, the third storage unit 130, and the fourth storage unit 140 in FIG. 1B, the dimension of the semiconductor package structure 20 shown in FIG. 2 along the horizontal direction/dimension/axis is shorter than that of the semiconductor package structure 10B shown in FIG. 1B. The horizontal direction/dimension/axis is measured across a dimension parallel to at least one of the surfaces 200$s$1, 220$s$1, 220$s$2, 230$s$1, 230$s$2, 250$s$1, and 250$s$2.

Figure 3:
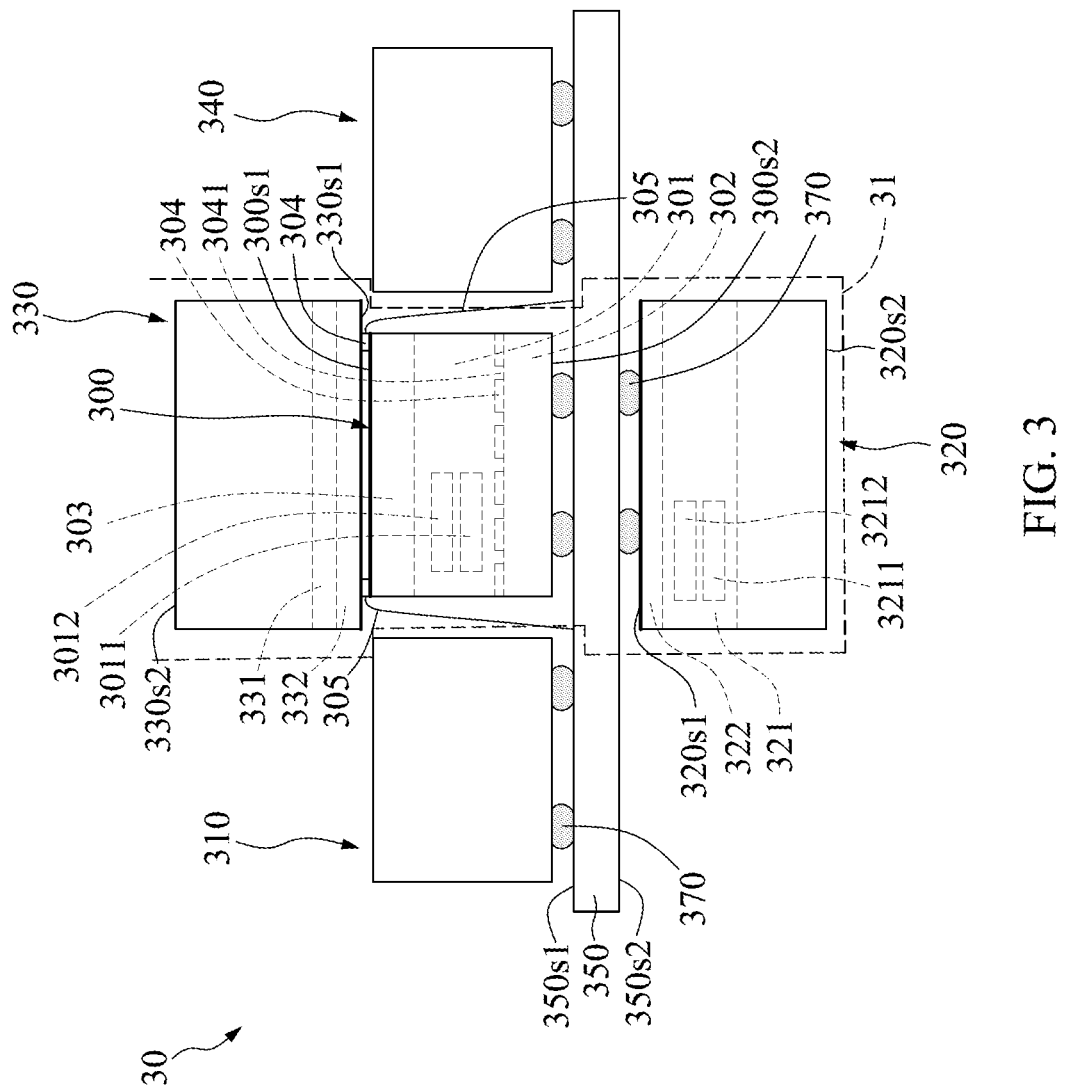
FIG. 3 is a side view of a semiconductor package structure 30 in accordance with yet another arrangement of the present disclosure.

FIG. 3 is a side or cross-sectional view of a semiconductor package structure 30 in accordance with yet another arrangement of the present disclosure. Referring to FIG. 1B and FIG. 3, the semiconductor package structure 30 shown in FIG. 3 may be similar to the semiconductor package structure 10B shown in FIG. 1B, with the differences including that the first storage unit 310 and the fourth storage unit 340 (e.g., high-bandwidth memories) are disposed on opposite lateral sides of the processing component 300. The second storage unit 220 (e.g., cache memory chiplets) is disposed on the surface 350$s$2 opposite to the surface 350$s$1 on which the processing component 300, the first storage unit 310, and the fourth storage unit 340 are disposed. In addition, the third storage unit 330 may be stacked on the processing component 300. For example, the surface 330s1 (e.g., an active side) of the third storage unit 330 and the surface 300s1 (e.g., an active side) of the processing component 300 may facing each other. In addition, a plurality of conductive elements 304 may be disposed between the surface 330s1 and the surface 300s1. A portion of the conductive elements 304 may electrically connect the logic region 301 of the processing component 300 to the circuit structure 350 via respective wire bonding 305. Another portion of the conductive elements 304 may electrically connect the third storage unit 330 to the circuit structure 350 via respective wire bonding 305. An external power source (not shown) may be converted by a power component (not shown) disposed on the circuit structure 350 to provide power (e.g., DC power) to the third storage unit 330 via respective wire bonding 305. In some arrangements, the memory size of the third storage unit 330 may be smaller than that of the second storage unit 320, and the dimension of the third storage unit 330 on the X-Y plane is smaller than that of the second storage unit 320. Thus, the dimension of the third storage unit 330 on the X-Y plane may be closer to that of the processing component 300, thus facilitating stacking the third storage unit 330 over the processing component 300. Therefore, the distance between the third storage unit 330 and the processing component 300 can be reduced, thus reducing the RC delay and increasing the performance of data accessing.

In some arrangements, an external power source (not shown) may be converted by a power component (not shown) disposed on the circuit structure 350 to provide power (e.g., DC power) to the processing component 300 via the power interface 302 disposed close to the surface 300s2 (e.g., a backside or a passive side), and the processing component 300 may provide power to the third storage unit 330 via one or more TSVs (through-silicon vias, not shown in FIG. 3).

In some arrangements, the logic region 321 of the second storage unit 320 may include a memory controller 3211 and memory interface 3212 which are respectively similar to the memory controller 1011 and memory interface 1012 shown in FIG. 1B. Specifically, the processing component 300 shown in FIG. 3 may be a cache-less processor which is not equipped with the memory controller and memory interface for controlling data access of the first storage unit 310 and the fourth storage unit 340 (e.g., high-bandwidth memories). The memory controller 3211 may be configured to control data access of the first storage unit 310 (e.g., a high-bandwidth memory) via the memory interface 3212 and the circuit structure 350 based on one or more memory access commands from the processing component 300. For example, the memory controller 3211 may be configured to receive a memory access command from the processing component 300 to enable the first storage unit 310 to provide data for the processing component 300. The second storage unit 320 may be configured to function as a bridge component between the first storage unit 310 and the processing component 300.

In some arrangements, the memory controller 3211 may be further configured to control data access of the fourth storage unit 340 (e.g., another high-bandwidth memory) via the memory interface 3212 and circuit structure 350. Thus, the second storage unit 320 may also be configured to function as another bridge component between the fourth storage unit 340 and the processing component 300.

The semiconductor package structure 30 shown in FIG. 3 may have a smaller package size than the semiconductor package structure 10B shown in FIG. 1B. Specifically, assuming that the sizes of the processing component 300, the first storage unit 310, the second storage unit 320, the third storage unit 330, and the fourth storage unit 340 in FIG. 1B correspond to the sizes of the processing component 100, the first storage unit 110, the second storage unit 120, the third storage unit 130, and the fourth storage unit 140 in FIG. 1B, the dimension of the semiconductor package structure 30 shown in FIG. 3 along the horizontal direction is shorter than that of the semiconductor package structure 10B shown in FIG. 1B. In some arrangements, the processing component 300, the second storage unit 320, the third storage unit 330, and the circuit structure 350 can be collectively referred to as a processing structure 31.

Figure 4:
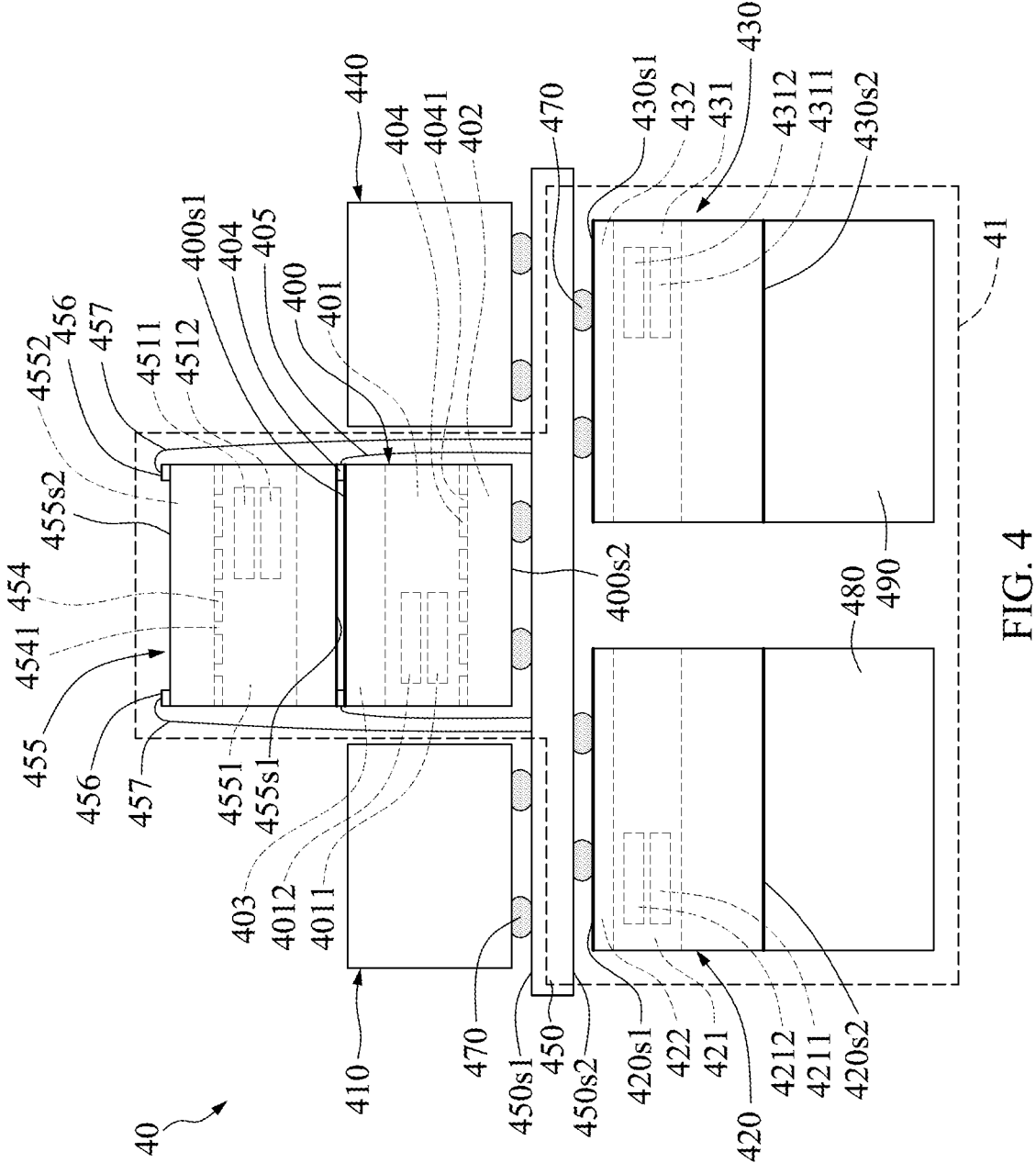
FIG. 4 is a side view of a semiconductor package structure 40 in accordance with yet another arrangement of the present disclosure.

FIG. 4 is a side or cross-sectional view of a semiconductor package structure 40 in accordance with yet another arrangement of the present disclosure. Referring to FIG. 2 and FIG. 4, the semiconductor package structure 40 shown in FIG. 4 may be similar to the semiconductor package structure 20 shown in FIG. 2, with the differences including that a fifth storage unit 480 and a sixth storage unit 490 may be respectively stacked on the second storage unit 420 and the third storage unit 430 along the vertical direction/dimension/axis (e.g., perpendicular to at least one of the surfaces 420s1, 420s2, 430s1, 430s2, 450s1, 450s2, 455s1, and 455s2), and a second processing component 455 may be stacked on the first processing component 400 along the vertical direction/dimension/axis. The fifth storage unit 480 and the sixth storage unit 490 may be cache-memory chiplets as well as the second storage unit 420 and the third storage unit 430.

In some arrangements, the second storage unit 420, the third storage unit 430, the fifth storage unit 480, and the sixth storage unit 490 may be powered from their front sides (or active sides), such as surfaces 420s1, 430s2, 480s1, and 490s1. An external power source (not shown) may be converted by a power component (not shown) disposed on the circuit structure 450 to provide power (e.g., direct-current (DC) power) to the second storage unit 420 and the third storage unit 430 via respective electrical contacts 470. The second storage unit 420 may provide power to the fifth storage unit 480 via one or more respective TSVs (not shown in FIG. 4), and data communication between the second storage unit 420 and the fifth storage unit 480 may pass through the one or more respective TSVs. Similarly, the third storage unit 430 may provide power to the sixth storage unit 490 via one or more respective TSVs (not shown in FIG. 4), and data communication between the third storage unit 430 and the sixth storage unit 490 may pass through the one or more respective TSVs.

Moreover, the first processing component 410 and the second processing component 455 may be powered from their backsides (or passive sides), such as surfaces 400s2 and 455s2. An external power source (not shown) may be converted by a power component (not shown) disposed on the circuit structure 450 to provide power (e.g., direct-current (DC) power) to the first processing component 400 via respective electrical contacts 470. In addition, a plurality of conductive elements 456 may be disposed on the surface 455s2, and the conductive elements 456 may electrically connect the second processing component 455 to the circuit structure 450 via respective wire bonding 457. Thus, the power component (not shown) disposed on the circuit structure 450 to provide power (e.g., DC power) to the second processing component 455 via respective electrical contacts 457.

In addition, a portion of the conductive elements 404 may electrically connect the logic region 401 of the first processing component 400 to the circuit structure 450 via respective wire bonding 405. Another portion of the conductive elements 404 may electrically connect the third storage unit 430 to the circuit structure 450 via respective wire bonding 405. Accordingly, the semiconductor package structure 40 shown in FIG. 4 may provide more computing resources and a larger cache capacity than the semiconductor package structure 20 shown in FIG. 2. In some arrangements, the processing components 400 and 455, the second storage unit 420, the third storage unit 430, the fifth storage unit 480, the sixth storage unit 490, and the circuit structure 450 can be collectively referred to as a processing structure 41.

In some arrangements, a first technology-node difference between the second storage unit 420 and the third storage unit 430 may be smaller than a second technology-node difference between the second storage unit 420 and the processing component 400. In some arrangements, the technology nodes of the second storage unit 420 and the third storage unit 430 may be the same, and the technology nodes of the processing components 400 and 455 may be the same. The technology nodes of the processing components 400 and 455 may be smaller than those of the second storage unit 420 and the third storage unit 430.

Figure 5:
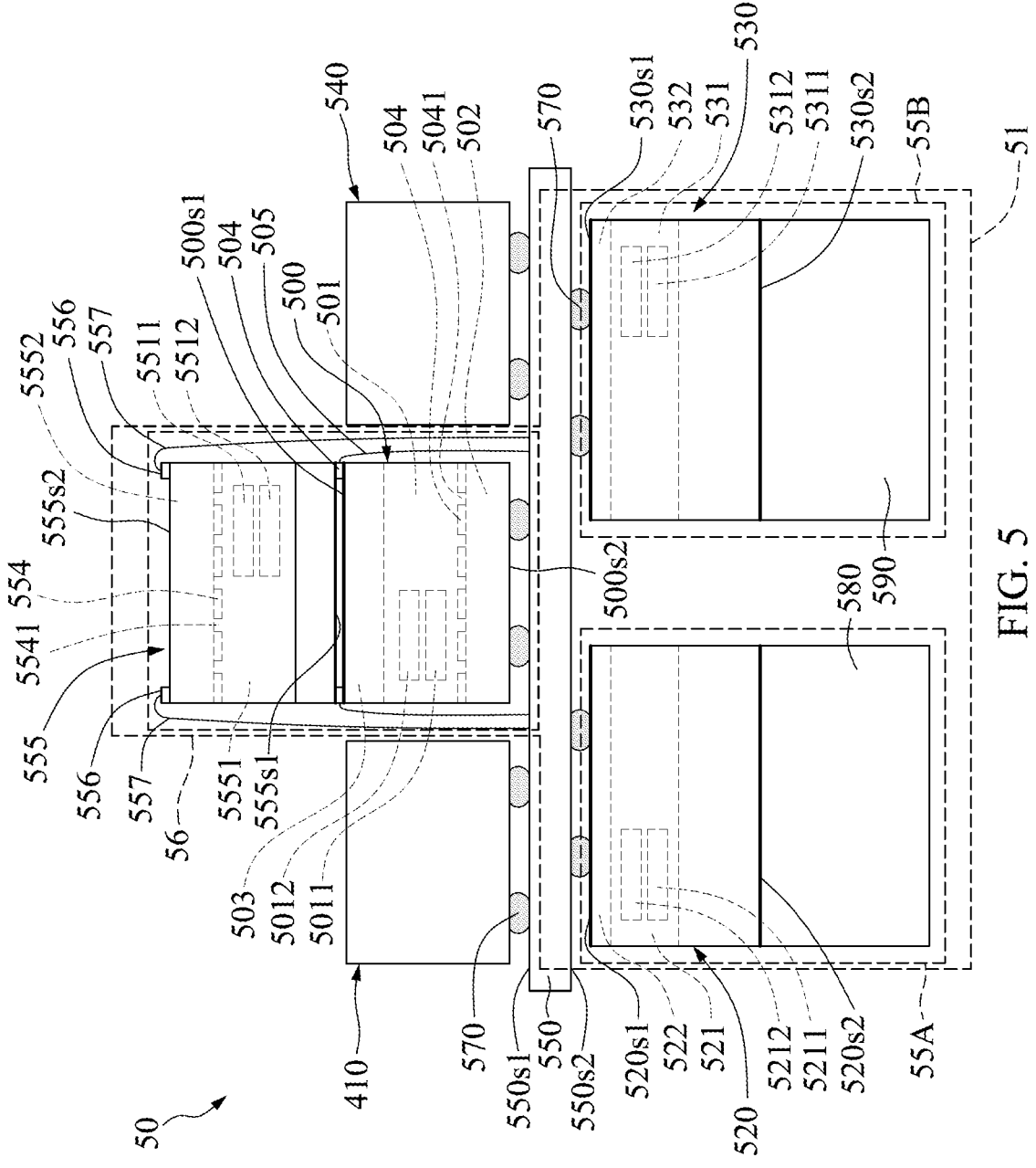
FIG. 5 is a side view of a semiconductor package structure 50 in accordance with yet another arrangement of the present disclosure.

FIG. 5 is a side or cross-sectional view of a semiconductor package structure 50 in accordance with yet another arrangement of the present disclosure. Referring to FIG. 4 and FIG. 5, the semiconductor package structure 50 shown in FIG. 5 may be similar to the semiconductor package structure 40 shown in FIG. 4, with the difference therebetween that the fifth storage unit 580 and the sixth storage unit 590 in the semiconductor package structure 50 may be DRAMs. Thus, the fifth storage unit 580 and the sixth storage unit 590 may include DRAMs that are used as cache memories together with the second storage unit 520 and the third storage unit 530 (e.g., volatile memories or SRAMs) to increase the cache-memory capacity of the semiconductor package structure 50.

Accordingly, in comparison with the semiconductor package structure 40 shown in FIG. 4, the semiconductor package structure 50 shown in FIG. 5 may have higher computation capability and a larger cache-memory capacity.

In some arrangements, the logic region 521 of the second storage unit 520 may include a memory controller 5211 and a memory interface 5212, the memory controller 5211 may be configured to control data access of first storage unit 510 via the memory interface 5212 and the circuit structure 550 based on one or more memory access commands from the first processing component 500 and/or the second processing component 555. In addition, the memory controller 5211 may be further configured to control data access of the fifth storage unit 580 (e.g., a DRAM) based on one or more memory access commands from the first processing component 500 and/or the second processing component 555.

Similarly, the logic region 531 of the third storage unit 530 may include a memory controller 5311 and a memory interface 5312, the memory controller 5311 may be configured to control data access of an external high-bandwidth memory via the memory interface 5312 and the optoelectronic structure 510B based on one or more memory access commands from the first processing component 500 and/or the second processing component 555. In addition, the memory controller 5311 may be further configured to control data access of the sixth storage unit 590 (e.g., a DRAM) based on one or more memory access commands from the first processing component 500 and/or the second processing component 555. In the aforementioned arrangements, the fifth storage unit 580 and the sixth storage unit 590 may be used as large cache memories, and thus the cache-memory capacity that can be allocated by the first processing component 500 and the second processing component 555 can be increased using the design of the stacked memory structures 55A and 55B. In some arrangements, the processing components 500 and 555, the second storage unit 520, the third storage unit 530, the fifth storage unit 580, the sixth storage unit 590, and the circuit structure 550 can be collectively referred to as a processing structure 51.

Figure 6A:
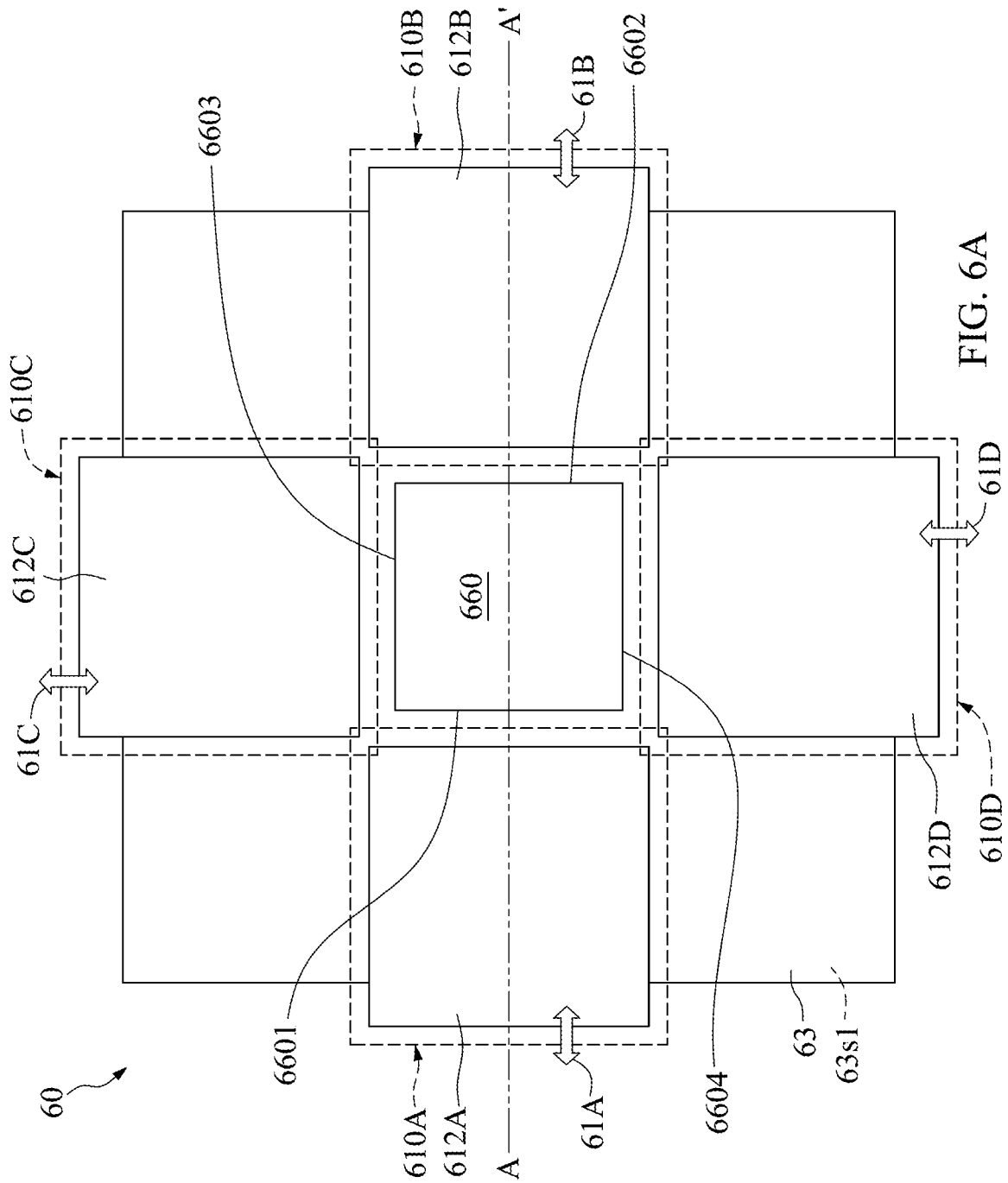
FIG. 6A is a top view of a semiconductor package structure 60 in accordance with yet another arrangement of the present disclosure.
Figure 6B:
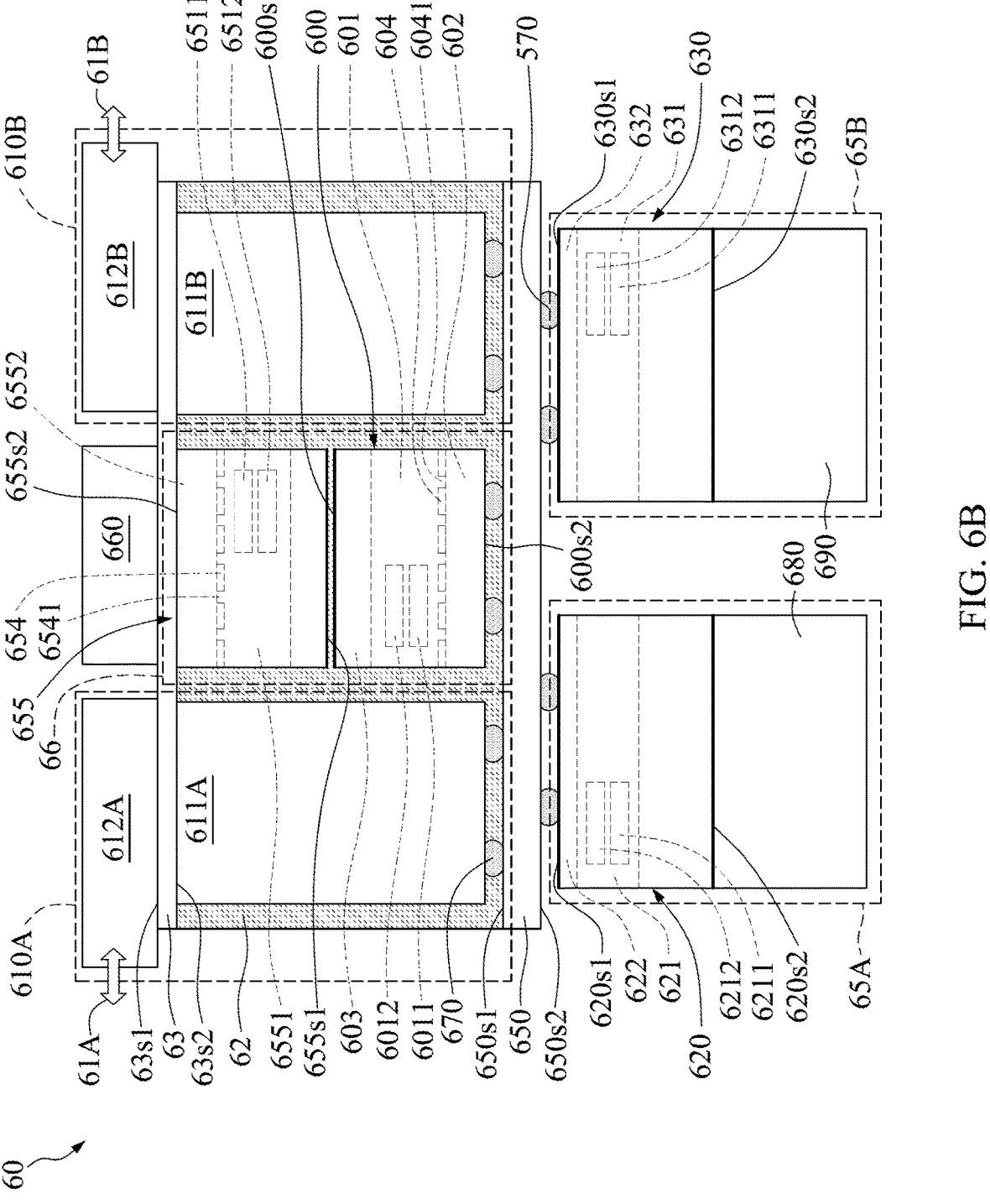
FIG. 6B is a cross-section of the semiconductor package structure 60 along line AA' in FIG. 6A, in accordance with yet another arrangement of the present disclosure.

FIG. 6A is a top view of a semiconductor package structure 60 in accordance with yet another arrangement of the present disclosure. FIG. 6B is a cross-section of the semiconductor package structure 60 along line AA' in FIG. 6A. Referring to FIG. 5 and FIGS. 6A-6B, in some arrangements, the semiconductor package structure 60 may include optoelectronic structures 610A-610D, a first processing component 600, a second processing component 655, a circuit structure 650, a first storage structure 65A, a second storage structure 65B, and a passive element 660. In some arrangements, the storage structures 65A and 65B may be similar to the stacked structure 55A and 55B shown in FIG. 5. The storage structure 65B may be similar to the storage structure 55B shown in FIG. 5. In some arrangements, the stacked structure 66 of the first processing component 600 and the second processing component 655 shown in FIG. 6B may be similar to the stacked structure 56 of the first processing component 500 and the second processing component 555 shown in FIG. 5.

In some arrangements, the stacked structure 66 of the first processing component 600 and the second processing component 655 shown in FIG. 6B may be different from the stacked structure of the first processing component 500 and the second processing component 555 shown in FIG. 5. For example, the surfaces 600s2 and 655s2 may be referred to as backsides of the first processing component 600 and the second processing component 655. The first processing component 600 and the second processing component 655 may be provided with backside power respectively from the surfaces 600s2 and 655s2. For brevity, the conductive elements and corresponding wire bonding electrically connecting the surface 600s2 of the first processing component 600 and the circuit structure 650 are not shown in FIG. 6B.

In some implementations, the passive element 660 may be a silicon capacitor electrically connected to the second processing component 655 via the connection element 63. The passive element 660 may be disposed on the surface 63s1 of the connection element 63. In addition, the passive element 660 may be electrically connected to the circuit structure 650 via respective conductive elements and wire bonding (not shown). Thus, the power component (not shown) disposed on the circuit structure 650 or an external power source (not shown) may provide power to the passive element 660 via respective wire bonding (not shown). The passive element 660 may stabilize the power received from the circuit structure 650 or the external power source, and provide stabilized power to the second processing component 655.

The optoelectronic structures 610A-610D may be electrically connected to the first processing component 600 and the second processing component 655 via the circuit structure 650 and the connection element 63. The first processing component 600 and the second processing component 655 of the semiconductor package structure 60 may communicate with an external chip or an external device (not shown) via one or more optical transmission paths (or optoelectronic transmission paths) 61A-61D corresponding to the optoelectronic structures 610A-610D. For example, taking the optoelectronic structure 610A as an example, the optoelectronic structure 610A may include an electronic component 611A and a photonic component 612A. The electronic component 611A may be an electronic integrated circuit (EIC) that relies on electrons to transmit or receive signals or data. The photonic component 611B may be a photonic integrated circuit (PIC) that relies on photons to transmit or receive signals or data.

A connection element 63 may be disposed between on the photonic component 611B and the electronic component 611A in the optoelectronic structure 610, and thus the electronic component 611A and the photonic component 612A may be spaced apart by a connection element 63. In some arrangements, the optoelectronic structure 610A may be configured to transmit an optical signal via one or more optical transmission paths (e.g., path regions or path 61A). In some arrangements, the optoelectronic structure 610A may be configured to emit or receive an optical signal via one or more optical transmission paths (e.g., path regions or path 61A). In some arrangements, the optical transmission paths may be optical fibers. The optoelectronic structures 610B, 610C, and 610D may be similar to the optoelectronic structure 610A, the details of which will not be repeated here. The electronic components 611A and 611B may be electrically connected to the circuit structure 650 via respective electrical contacts 670. The electrical contacts 670 may include controlled collapse chip connection (C4) bumps, a ball grid array (BGA), or a land grid array (LGA).

In some arrangements, the optoelectronic structures 610A-610D may be disposed close to respective sides 6601, 6602, 6603, and 6604 of the passive element 660, as shown in the top view of FIG. 6A. Thus, the semiconductor package structure 60 may transmit or receive optical signals via the optical transmission paths 61A-61D toward different directions. Accordingly, the first processing component 600 and the second processing component 655 may access one or more remote high-bandwidth memories (not shown) via the optical transmission paths 61A-61D corresponding to the optoelectronic structures 610A-610D.

In some arrangements, the second storage unit 620 and the third storage unit 630 shown in FIG. 6B may be similar to the second storage unit 520 and the third storage unit 530 shown in FIG. 5. For example, the second storage unit 620 and the third storage unit 630 may be electrically connected to the electronic component 611A via the circuit structure 650 and the respective electrical contacts 170 and 171. The logic region 621 of the second storage unit 620 may include a memory controller 6211 and a memory interface 6212, the memory controller 6211 may be configured to control data access of an external high-bandwidth memory via the memory interface 6212 and the optoelectronic structure 610A based on one or more memory access commands from the first processing component 600 and/or the second processing component 655. In addition, the memory controller 6211 may be further configured to control data access of the fifth storage unit 680 (e.g., a DRAM) based on one or more memory access commands from the first processing component 600 and/or the second processing component 655.

Similarly, the logic region 631 of the third storage unit 630 may include a memory controller 6311 and a memory interface 6312, the memory controller 6311 may be configured to control data access of an external high-bandwidth memory via the memory interface 6312 and the optoelectronic structure 610B based on one or more memory access commands from the first processing component 600 and/or the second processing component 655. In addition, the memory controller 6311 may be further configured to control data access of the sixth storage unit 690 (e.g., a DRAM)

based on one or more memory access commands from the first processing component 600 and/or the second processing component 655. In the aforementioned arrangements, the fifth storage unit 680 and the sixth storage unit 690 may be used as large-size cache memories, and thus the cache-memory capacity that can be allocated by the first processing component 600 and the second processing component 655 can be increased using the design of the storage structures 65A and 65B.

In some arrangements, the surfaces 611As1, 655$s$1, and 611Bs1 of the electronic component 611A, the second processing component 655, and the electronic component 611B may be substantially level, and a connection element 63 may be disposed on the surfaces 611As1, 655$s$1, and 611Bs1. The connection element 63 may include an electronic interposer, a circuit board, or a circuit structure, but the present disclosure is not limited thereto.

In some arrangements, the components and/or elements between the connection elements 650 and 63, such as the first processing component 600, the second processing component 655, the electronic components 611A-611B, and electronic components 611C and 611D (not shown in FIGS. 6A-6B) in the optoelectronic structures 61C and 61D, may be encapsulated by a protective component 62, which may include an encapsulant or a dielectric structure. In some arrangements, the protective component 62 may include an epoxy resin including fillers, a molding compound (e.g., an epoxy molding compound or other molding compound), polyimide, a phenolic compound or material, a material including silicone dispersed therein, or a combination thereof. The protective component 62 may be configured to protect the components and/or elements between the connection elements 650 and 63. In addition, the protective component 62 may improve the rigidity and reliability of semiconductor package structure 60, such as ensuring the connection of the electrical contacts 670, and protecting the processing components 600 and 655 and the electronic components 611A and 611B from moisture.

In some arrangements, the electrical contacts 671 that electrically connects the second storage unit 620 and the third storage unit 630 to the circuit structure 650 may not be encapsulated by the protective component 62. In some arrangements, the electrical contacts 671 may be covered or encapuslated by an underfill (not shown in FIGS. 6A-6B) to increase the rigidity of the electrical contacts 671.

While the present disclosure has been described and illustrated with reference to specific arrangements thereof, these descriptions and illustrations do not limit the present disclosure. It should be understood by those skilled in the art that various changes may be made and equivalents may be substituted without departing from the true spirit and scope of the present disclosure as defined by the appended Claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the Claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, the terms "approximately," "substantially," "substantial," and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

What is claimed is:

1. A chiplet module, comprising:
a circuit structure having a first side and a second side opposite to the first side;
a processing structure comprising:
    a first processing chiplet, disposed at the first side of the circuit structure, and a portion of the first side being exposed by the first processing chiplet; and
    a first memory chiplet, disposed at the second side of the circuit structure and electrically connected to the first processing chiplet via the circuit structure,
wherein the processing structure comprises a second memory chiplet disposed under the first memory chiplet, and the second memory chiplet is electrically connected to the first processing chiplet via the first memory chiplet, wherein the chiplet module further comprises:
a third memory chiplet, disposed at the second side of the circuit structure, wherein a first technology-node difference between the first memory chiplet and the third memory chiplet is smaller than a second technology-node difference between the first memory chiplet and the first processing chiplet.

2. The chiplet module of claim 1, further comprising:
a first storage unit, disposed over the portion of the first side of the circuit structure; and
wherein the first storage unit is electrically connected to the first processing chiplet via the circuit structure.

3. The chiplet module of claim 1, wherein the processing structure further comprises:
a second processing chiplet disposed over the first processing chiplet and electrically connected to first processing chiplet.

4. An electronic device, comprising:
a circuit structure;
a processing component disposed over the circuit structure;
a storage structure disposed under the circuit structure, configured to provide data to be accessed by the processing component; and
an optoelectronic structure, disposed over the circuit structure, configured to provide optoelectronic transmission paths between the processing component and an external device.

5. The electronic device of claim 4, wherein the optoelectronic structure comprises an electronic component and a photonic component stacked over the electronic component.

6. The electronic device of claim 5, wherein the storage structure comprises a first memory unit and a second memory unit stacked on the first memory unit.

7. The electronic device of claim 6, further comprising: an encapsulant encapsulating the electronic component and the processing component, wherein the photonic component is disposed over the encapsulant.

* * * * *